(12) United States Patent
deVilliers

(10) Patent No.: US 9,645,391 B2
(45) Date of Patent: *May 9, 2017

(54) SUBSTRATE TUNING SYSTEM AND METHOD USING OPTICAL PROJECTION

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/974,974

(22) Filed: Dec. 18, 2015

(65) Prior Publication Data

US 2016/0147164 A1 May 26, 2016

Related U.S. Application Data

(63) Continuation-in-part of application No. 14/554,382, filed on Nov. 26, 2014.

(51) Int. Cl.
*G03B 27/32* (2006.01)
*G02B 26/10* (2006.01)
(Continued)

(52) U.S. Cl.
CPC ......... *G02B 26/105* (2013.01); *G02B 26/085* (2013.01); *G03F 7/70991* (2013.01);
(Continued)

(58) Field of Classification Search
CPC ............ G03F 7/70616; G03F 7/70891; G03F 7/70466; G03F 7/7091; G03F 7/704669
(Continued)

(56) References Cited

U.S. PATENT DOCUMENTS 5,580,471 A 12/1996 Fukumoto et al.
5,655,110 A 8/1997 Krivokapic et al.
(Continued)

FOREIGN PATENT DOCUMENTS

EP 1603153 2/2004
EP 1753017 4/2005
JP 2007-501431 1/2007

OTHER PUBLICATIONS

International Patent Application No. PCT/US2014/067565, "International Search Report and Written Opinion," mailed Mar. 3, 2015, International Filing Date Nov. 26, 2014.

(Continued)

*Primary Examiner* — Hung Henry Nguyen

(57) ABSTRACT

Techniques herein include systems and methods that provide a spatially-controlled or pixel-based projection of light onto a substrate to tune various substrate properties. A given pixel-based image projected on to a substrate surface can be based on a substrate signature. The substrate signature can spatially represent non-uniformities across the surface of the substrate. Such non-uniformities can include energy, heat, critical dimensions, photolithographic exposure dosages, etc. Such pixel-based light projection can be used to tune various properties of substrates, including tuning of critical dimensions, heating uniformity, evaporative cooling, and generation of photo-sensitive agents. Combining such pixel-based light projection with photolithographic patterning processes and/or heating processes improves processing uniformity and decreases defectivity.

19 Claims, 4 Drawing Sheets

(51) Int. Cl.
- *G02B 26/08* (2006.01)
- *G03F 7/20* (2006.01)
- *H01L 21/67* (2006.01)
- *H01L 21/66* (2006.01)

(52) U.S. Cl.
CPC .. *H01L 21/67248* (2013.01); *H01L 21/67253* (2013.01); *H01L 22/12* (2013.01)

(58) Field of Classification Search
USPC ........................................ 355/27–30, 53, 67
See application file for complete search history.

(56) References Cited

U.S. PATENT DOCUMENTS

| | | | |
|---|---|---|---|
| 6,248,168 B1* | 6/2001 | Takeshita | B05D 1/005 118/302 |
| 6,285,488 B1* | 9/2001 | Sandstrom | B23K 26/032 250/492.1 |
| 6,479,820 B1 | 11/2002 | Singh et al. | |
| 6,573,480 B1 | 6/2003 | Rangarajan et al. | |
| 2002/0113056 A1 | 8/2002 | Sugaya et al. | |
| 2002/0177094 A1 | 11/2002 | Shirakawa | |
| 2002/0182514 A1 | 12/2002 | Montgomery et al. | |
| 2006/0132746 A1 | 6/2006 | Baselmans et al. | |
| 2008/0318806 A1 | 12/2008 | Gao et al. | |
| 2009/0275149 A1 | 11/2009 | Michaelson et al. | |
| 2010/0002355 A1 | 1/2010 | Morooka | |
| 2010/0227063 A1 | 9/2010 | Amro et al. | |
| 2011/0018167 A1 | 1/2011 | Koole et al. | |
| 2011/0045387 A1 | 2/2011 | Allen et al. | |
| 2011/0147984 A1 | 6/2011 | Cheng et al. | |
| 2012/0015305 A1 | 1/2012 | Garner | |
| 2012/0214099 A1 | 8/2012 | Chen et al. | |
| 2013/0017157 A1 | 1/2013 | Grit et al. | |
| 2013/0057552 A1* | 3/2013 | Yoshiwa | H01J 37/3026 345/441 |
| 2014/0347643 A1 | 11/2014 | Kotoku et al. | |
| 2015/0146178 A1* | 5/2015 | devilliers | H01L 21/67248 355/30 |

OTHER PUBLICATIONS

International Patent Application No. PCT/US2015/012592, "International Search Report and Written Opinion," International Filing Date Jan. 23, 2015, International Search Report and Written Opinion mailed Apr. 30, 2015.

Taiwanese Patent Application No. 103141239, "Notification of Examination Opinions," Filing date Nov. 27, 2014, Notification of Examination Opinions dated Jul. 25, 2016.

* cited by examiner

SUBSTRATE TUNING SYSTEM AND METHOD USING OPTICAL PROJECTION

CROSS REFERENCE TO RELATED APPLICATIONS

The present application is a continuation-in-part of U.S. patent application Ser. No. 14/554,382, filed on Nov. 26, 2014, entitled "Substrate Tuning System and Method Using Optical Projection," which is incorporated herein by reference in its entirety. U.S. patent application Ser. No. 14/554,382, in turn, claims the benefit of U.S. Provisional Patent Application No. 61/909,714, filed on Nov. 27, 2013, as well as U.S. Provisional Patent Application No. 61/932,005, filed on Jan. 27, 2014.

BACKGROUND OF THE INVENTION

This disclosure relates generally to patterning of substrates including semiconductor substrates such as silicon wafers. This disclosure also relates to processes involved with photolithography including coating and developing films on substrates as part of semiconductor device fabrication. This disclosure particularly relates to controlling dimensions and accuracy of patterned features as part of photolithography and patterning processes.

Photolithography involves coating substrates with films that are sensitive to electromagnetic (EM) radiation, exposing these films to a pattern of a actinic radiation to define a latent pattern within the film, and then developing (dissolving and removing) some of the film to reveal a physical or relief pattern on the substrate. Fabrication tools for coating and developing substrates typically include many modules that can be used to add film, add resist, and develop a substrate.

SUMMARY

Techniques herein include systems and methods that provide a spatially-controlled projection of light or electromagnetic (EM) radiation onto a substrate. A wavelength of 400-700 nm light, Ultra Violet Light (UV), infrared light, or any wavelength directed at an object can treat a substrate either by heating or providing actinic radiation.

This disclosure addresses techniques for spatially altering substrate critical dimensions (CDs) and/or temperature and can be applicable to vacuum and non-vacuum processing systems in semiconductor, flat panel display, and photovoltaic systems including deposition systems, etching systems (wet and dry). For example, pixel-based projected light patterns can correct critical dimensions, lithographic exposure non-uniformities, stepper exposure lag time, and so forth.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
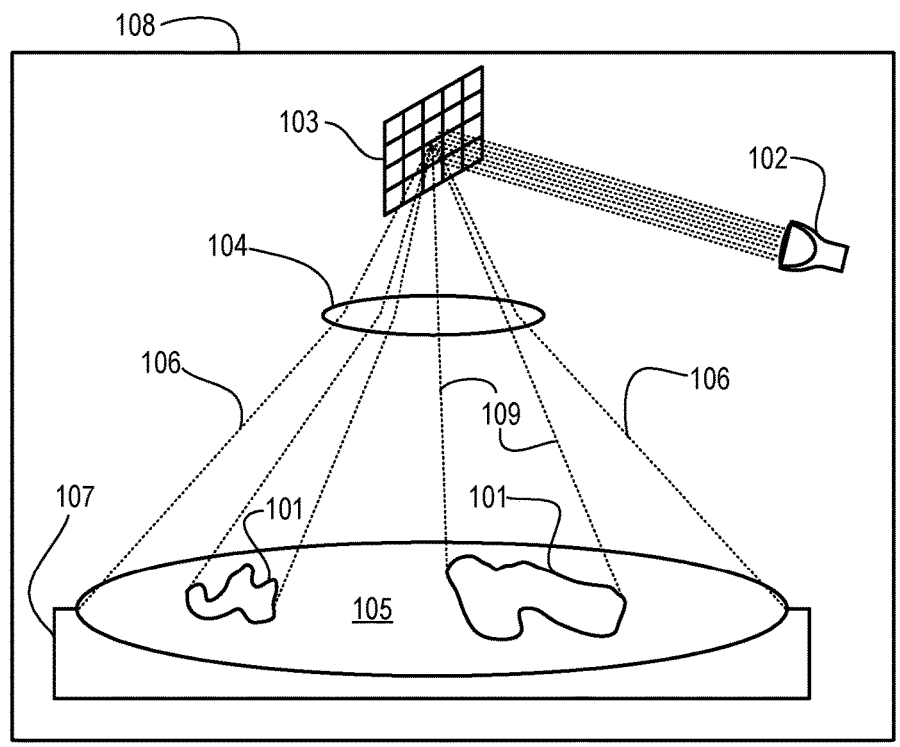
FIG. 1 is a schematic perspective illustration of an example image projection system for tuning a substrate.

Techniques herein include systems and methods that provide a spatially-controlled or pixel-based projection of light onto a substrate to tune various substrate properties. Such pixel-based light projection can be used to tune various properties of substrates, including tuning of critical dimensions (CDs), heating uniformity, evaporative cooling, photolithographic flare, raster delay, and generation of photosensitive agents. Such pixel-based light projection can achieve significant improvements in critical dimension uniformity across a surface of a substrate. Combining such pixel-based light projection with photolithographic patterning processes can improve processing uniformity and decrease defectivity.

In one embodiment, a digital light processing (DLP) chip, grating light valve (GLV), laser galvanometer, or other grid-based micro projection technology, coupled with a light source, can focus an image (optionally using a lens) onto a substrate and correct or adjust critical dimension, temperature, and other non-uniformities. The system can be configured to vary the radiation output of the projected image. For example a solid white image with a visible spectrum bulb projected onto the plate will heat the plate to a given maximum temperature for that particular bulb. A temperature per projected pixel can be adjusted by using all, none, or some of the wavelengths of light produced by that light source. Such a technique gives extremely precise control over a given baking process of semiconductors, sufficient to bake semiconductors to within 1 nm. Likewise, an amount of actinic radiation per projected pixel location on a working surface of a substrate can be adjusted between no projected radiation and full projected radiation (for a given light source) with many gradations in between. A DLP chip or laser galvanometer can, for example, project an image onto a substrate and change the amount of heat or CD adjustment (via generation of photo active agents) at any specific point or points on the substrate.

A projected image as disclosed herein can vary output to individual features on a substrate depending on a number of pixels or size of pixel projection supported by a selected projection system and the incident area. That is, CD control available from using micro-mirror projection can be as flexible or fine-tuned as its maximum projected resolution. Note that systems herein can be configured to project a given image onto a substrate either as a simultaneous projection of all indicated pixel locations, or as a raster scan projection in which a given image is projected line-by-line on to the substrate. In one embodiment, a pixel-based light projection system is connected to a control computer of a baking device, exposure chamber, dispense chamber, hotplate, etch chamber, etc. The pixel-based light projection system can optionally be focused through a lens system into an exposure chamber where a substrate is aligned. Light projected onto or at the substrate then adjusts desired areas of the substrate such as by generating more photo acid. There are several uses of such a method and system. One application is to maintain temperature uniformity. Another application is to reduce or increase the critical dimensions on wafers being fabricated as part of semiconductor manufacturing.

FIG. 1 illustrates a schematic diagram of an example substrate tuning system. Processing chamber 108 can be sized for receiving a substrate, such as a silicon wafer, flat panel, etc. Processing chamber 108 can be a relatively minimum size (based on a size of the substrate) such as with a module mounted within a larger tool. A substrate alignment system 107 can be used to align an image onto a workable area on the substrate, which can be aligned within 0.1 nanometers. Substrate 105 can be positioned on a substrate holder. Substrate 105 can be a conventional reflective or non-reflective silicon disk with any type of coating.

The system includes light source 102 that can be located within, adjacent to, or remote from the processing chamber 108. Light source 102 can be any of several light sources such as visible light source, infrared light source, UV light source, lasers, or bulbs producing other wavelengths of light. Light source characteristics can be tailored to (or selected for) a particular substrate being treated and a particular tuning application. For some substrates, a 60 Watt (or equivalent) source may be sufficient, with a wavelength range of 400-700 nm, and a DLP resolution of 1080 p (1080 horizontal lines of vertical resolution and progressive scan). Other applications may require higher power and higher resolution. The light source can be selected based on particular wavelength(s) desired. For example an ultraviolet light source can be selected for certain applications, while a white or infrared source can be selected for other applications. Light source selection can be based on the absorption characteristics of a particular substrate and/or film. Any resolution can be used that is supported by DLP, GLV, laser galvanometer, or other light projection technologies.

Light projection device 103 can be embodied as a laser galvanometer, DLP chip, Grating light valve (GLV) or other light projection technology. DLP chips and GLVs are conventionally available. Digital laser galvanometers are also known. Lens system 104 can optionally be used to help produce an image, with minimal aberrations, the size of the substrate 105 as projected onto the substrate 105. Projection lines 106 represent an image field or video being projected toward substrate 105 either with simultaneous projection or raster-based projection. This video or image can be designed based on expected CD values and or dynamic feedback from a metrology device configured to identify differences in CDs across a substrate. Items 101 show example locations on substrate 105 that have critical dimensions different from other portions of the substrate. Projected image 109 projects light in the shape of one of items 101. If item 101 happens to have larger CD values as compared to the remaining surface area of the substrate 105, then projected image 109 can increase actinic radiation projected on these area to make a uniform CD value signature across the entire surface of substrate 105, such as by, for example, increasing generation of photo active agents to help remove excess material.

Such a system herein thus combines a fine and coarse control system for fine control of critical dimensions. Every location that a projected pixel can be turned on or off thus becomes an area that can have fine tuning for heat, temperature, CD correction, and photo reactivity.

Figure 5:
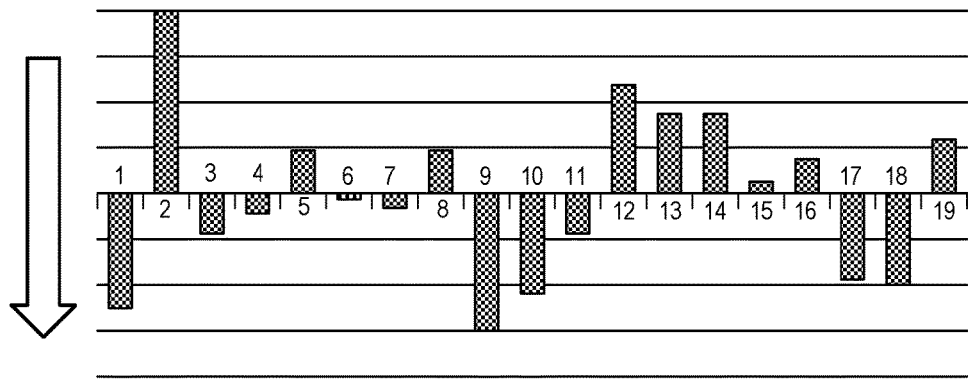
FIG. 5 is a diagram of an example simplified critical dimension or heat signature across a substrate cross section.

FIG. 5 is a graph illustrating a simplified example CD signature for a given substrate. This can be a CD signature across a cross-section of a substrate. In this example CD signature, there are 19 point locations for measuring relative differences in CDs. The top of this graph represents relatively greater CD variation or CD values. The bottom of the graph can also indicate relative differences in CDs, but can indicate CDs that are too small while the top of the graph indicates CDs that are too large. Note that there is a CD variation across the substrate, which variation of CDs by planar location is one embodiment of a heat signature.

Figure 6:
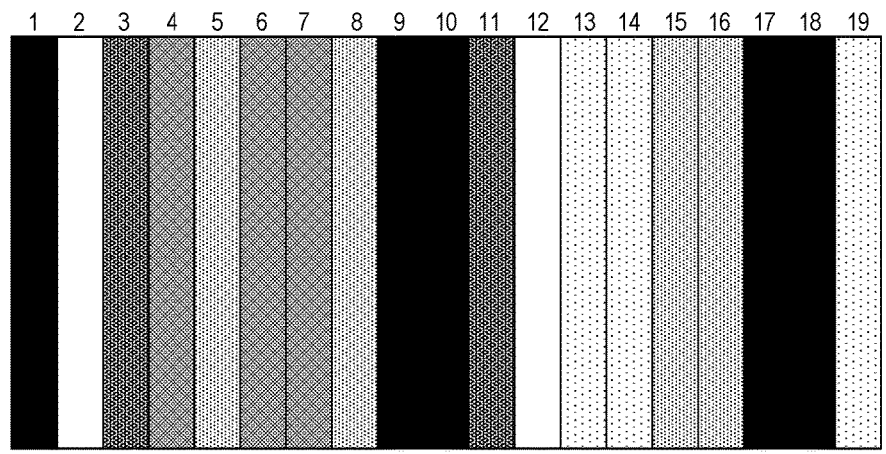
FIG. 6 is a diagram representing a projection image compensating for a given heat signature.
Figure 7:
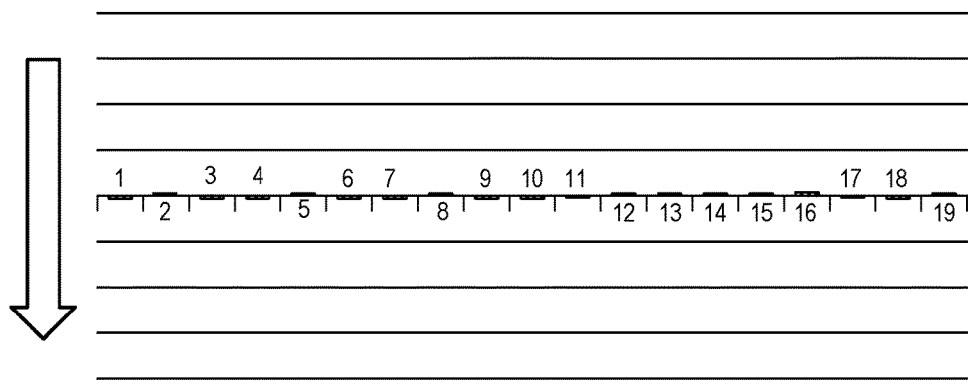
FIG. 7 is a diagram of an example simplified critical dimension or heat signature across a substrate cross section.
Figure 8:
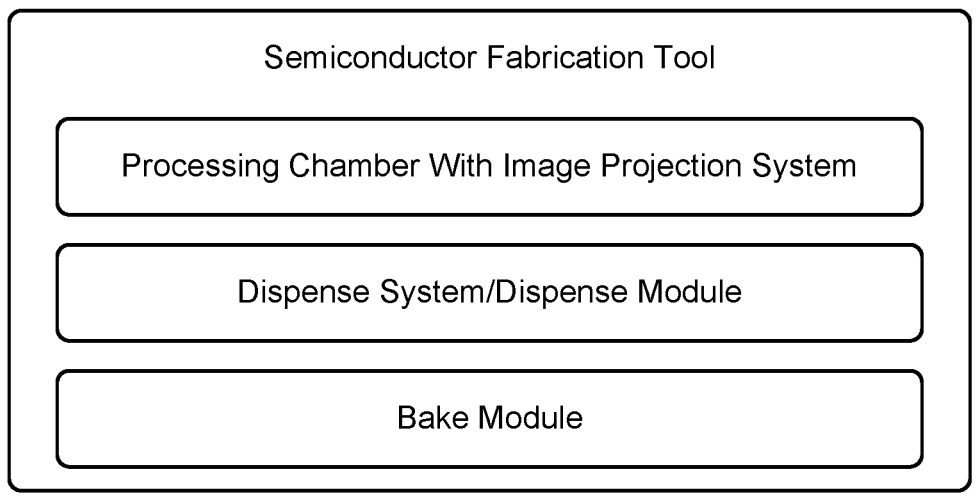
FIG. 8 is a schematic diagram of a semiconductor fabrication tool.

FIG. 6 is a diagram representing a projected image to correct CD variation from the CD signature represented in FIG. 5. In other words, the projected image compensates for the CD signature that has fluctuations. For example, note that points 1, 9, 10, 17, and 18 from the CD signature in FIG. 5 have a relatively small CD. Notice that the projected image in FIG. 6 has no light projected at these locations, which causes no increase in photo reactive agents. Point locations 2 and 12 from the CD signature in FIG. 5 have relatively large CDs, and so in the image projection in FIG. 6, these point locations are shown as white representing full light/radiation exposure to cause a maximum generation of photo reactive agents possible from a given light source. Other point locations are illustrated with varying shades of grey representing moderate fluctuations in CD values are similarly corrected with variable light projection. FIG. 7 shows a modified or corrected CD signature which is a result from the projected image in FIG. 6 applied to the CD signature of FIG. 5. Note that compared to the CD signature from FIG. 5, most CD values have been modified so that there is substantially less variation in CDs. Also note that the corrected CD signature can be realized after any intermediate steps of baking and/or developing to remove material from CDs that were larger than desired.

Figure 3:
FIG. 3 is an illustration representing an example substrate signature of a property that varies spatially.

The substrate signature illustrated in FIG. 5 is a simplified, linear signature. Substrates are typically planar and thus uniformity fluctuations can vary based on planar or X, Y, location on a substrate. FIG. 3 is an illustration depicting an example critical dimension signature. This critical dimension signature is mapped as point locations on the surface of a given substrate such as a wafer used in microfabrication processes. Note that various points on the CD signature illustration vary in degree of darkness or lightness. These relative differences at point locations on the CD signature illustration represent relative differences in CD uniformity. For example, point locations that are completely darkened can represent areas having CDs that are too small, whereas point locations that are completely lightened or lighter can represent areas having CDs that are too large. This CD signature can be generated based on observed and/or measured dimensions.

This substrate signature illustration in FIG. 3 can also represent what a given projection of light can look like on a substrate being treated. Note that a given light source can be UV or infrared and so FIG. 3 can represent what a projected energy signature looks like, or what the cumulative effect of an energy signature would look. Variations in darkness of hatching patterns can represent light intensity, amplitude and/or frequency. Accordingly, point locations on a substrate surface receiving a full intensity of projected light can include the light or white areas in the illustration. Likewise, point locations with less whitespace can have a medium intensity or partial intensity of light being projected at those locations. Point locations shown as black squares in this illustration might receive no light or relatively little light exposure. Note that substrate signatures can vary in visual representation based on type of signature or non-uniformity. For example, CD signatures may appear as having some perceptible lines corresponding to scribe lanes, signatures. A substrate signature showing raster delay non-uniformities can show evidence of progression of a given stepper/scanner across a substrate surface. Substrate signatures for heat non-uniformity may have circular patterns or show differences at heat zone interfaces.

Figure 4:
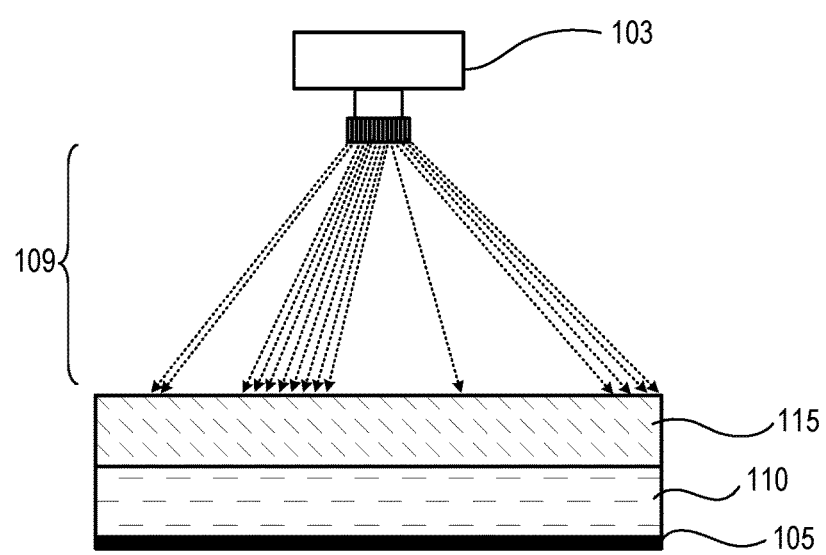
FIG. 4 is a schematic side view of an example image projection system for tuning a substrate.

FIG. 4 is similar to FIG. 1 and illustrates an example embodiment of an optical projection tuning system for tuning substrate 105. Substrate 105 can include a film 115, which could be a photoresist film, as well as underlying layer 110, which may become a hardmask or other patterned layer or memorization layer for pattern transfer. The light projection device 103, or accompanying controller, can receive a pixel-based image to project on substrate 105. Projection of this pixel-based image is shown with projected imaged 109. Note that portions of the substrate 105 are irradiated while others are not. Instead of a mask-based light projection used for photolithographic exposures, a pixel-based image projection is used. During projection, the projected image can change or vary such as in response to real time feedback or other tuning objectives.

A particular image or video that is projected can be based on one or more sensors that can gather data either before a treating process (static adjustment) or during a treating process for dynamic adjustment. In a feedback loop, a given sensor or sensor array can collect data (such as a CD signature) and then send this collected data to a controller. The controller can then compute an image to project onto a substrate based on the collected data and/or based on whether it is heat or light correction (CD correction) that is needed. A proportional-integral-derivative controller (PID controller) can be used to implement heat signature feedback. The image projected can change based on any oscillations across the substrate, such as center to edge oscillations.

Note that light intensity or amplitude can be adjusted based on a type of material on the surface of a substrate. For example, some polymers can have low reflectance, while other materials, such as silicon and metals, can have maximum reflectance values. In one specific example material, namely copper, reflectance can be 45% to 99%, but when light is incident on copper, the copper surface will heat up notwithstanding. Thus, techniques herein can be applied to most substrate materials.

Figure 2:
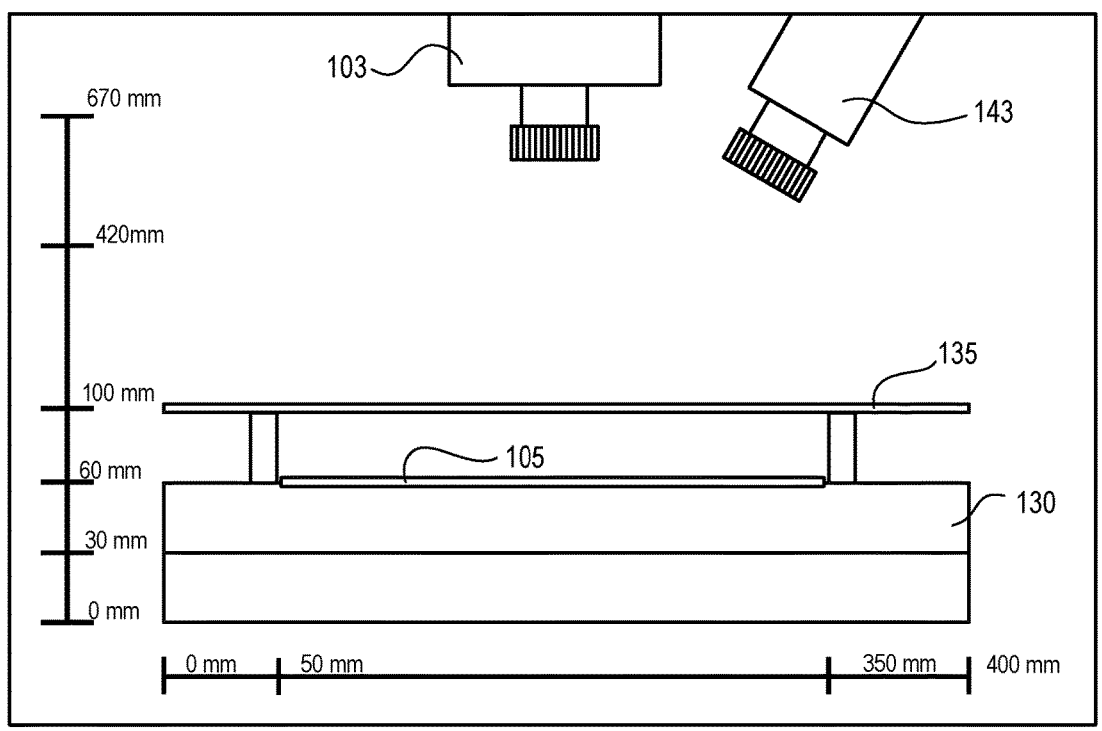
FIG. 2 is a schematic side view of an example image projection system for tuning a substrate.

FIG. 2 is a side-view diagram of an example system for improved substrate processing. A substrate 105 rests on a substrate holder 130, which can be embodied as, or include, a heat chuck. Above the substrate (facing a substrate side being treated) a laser galvanometer, DLP projector or the like can be positioned to project an image onto a substrate surface as part of light projection device 103. The location of the projector can vary based on space availability within a given chamber. For example, many heating modules of microfabrication tools are relatively short. In these embodiments, various apertures 135 and/or lens systems can be used to project an image within any limited vertical space above the substrate. Example height and width measurements are shown, but these are non-limiting and just to illustrate one particular embodiment.

Purpose-built light projection systems can be manufactured for use in such substrate tuning or heating modules. Alternatively, conventional laser galvanometers and DLP projectors can be used.

Other embodiments can use different wavelength lamps for light projection on to a single substrate. These lamps can all contribute to light projection, or be selectively activated. Likewise, multiple projectors per substrate processing module can be used. In other embodiments, light projection can have a frequency-based output for finer tuning, such as with 3D graphics. In addition to an image-based light projector, a camera 143 or other metrology device can be positioned in view of the substrate 105 to identify a given CD signature in real time for dynamic adjustment of a CD signature based projected image. In another embodiment, a sensor array can be installed and connected to a feedback loop of the PID controller.

Projecting a heat-signature based image onto a substrate positioned on a hotplate is just one embodiment of systems and methods herein. There are many additional applications and embodiments for treating substrates at various stages of semiconductor fabrication. Thus, applications are not limited to lithography. In another embodiment, the projected light-heat technique can be used during coating of a substrate (coating, for example, with a photo resist). Projecting an image onto a spinning substrate during coating of a liquid can help mitigate the evaporative cooling impact. The benefit is a lower dispense volume is needed while providing better coat uniformity. If there are non-transparent objects in a spin chamber that obstruct light projection, then light can at least be projected on a segment of the substrate, which would be essentially frequency-based projection because of the rotation of the substrate (this is for embodiments in which only a radial segment can be illuminated at a given point in time).

In other embodiments, light image projection can be used for both post application bake (PAB) and post exposure bake (PEB). Light image projection can be used for complex edge bead removal (EBR) clear outs—an area can be "drawn" or projected for edge bead removal. Light image projection can be used to define areas for directed self-assembly of block copolymers as a way to print an array. That is, exposure can be boosted sufficiently to where directed self-assembly (DSA) can print in an array, while remaining areas are not exposed so that the block copolymers will self-assemble without using a cut mask, which saves a process step in some microfabrication processes.

Embodiments can be used herein with wet or dry substrate cleaning systems. With wet cleaning systems, the projected light image can assist with center-to-edge temperature uniformity. In some processes in which a liquid is dispensed on a spinning substrate, a thickness of a film is greater toward the center of a substrate as compared to the edge. Techniques herein, however, can help even radial temperature uniformity. Depending on a location of dispense nozzles and dispense arms, an image that is projected in a dispense chamber may be essentially a partial image (e.g. pie-shaped image). Projecting onto only a portion of a substrate can nevertheless be effective especially with a spinning substrate because all of the surface can be irradiated or pass through a projected image. Projecting an image using UV light can further assist with reactivity of chemicals to improve radial reactivity of such chemicals as a spatial light augmentation technique that can be combined, for example, with a UV lamp directly providing most of the irradiation. Note that for UV light augmentation and projection, optics should be selected that enable UV transmission, such as quartz, calcium fluoride, or other transparent conducting media. For example, in many temperature augmentation and actinic radiation augmentation embodiments, the amount of augmentation is typically less than 15% of primary heat or actinic radiation treatment. For example, a given substrate with a photoresist film is exposed to a mask-based pattern with a scanner or stepper tool. With such photolithographic exposures, light dosage is essentially the same at each die location. Embodiments herein, then, can be used to augment exposure doses by relatively small amounts and different amounts depending on point location of the substrate.

As should be apparent, there are many and various embodiments for systems and methods disclosed herein.

One embodiment includes a system or apparatus for treating substrates. This system includes a chamber sized and configured to receive a substrate for processing. A substrate holder is positioned within the chamber and configured to hold the substrate. The system includes an image projection system configured to project an image onto an upper surface (that is, a working surface or surface being processed) of the substrate when the substrate is in the chamber. The image projection system uses a micro-mirror projection device to project the image. A micro-mirror device can include, for example, a controllable mirror for reflecting a laser beam, or an array of microscopic mirrors corresponding to pixels in an image to be projected. The system includes a controller configured to control the image projection system and cause the image projection system to project a pixel-based image onto the working surface of the substrate. The image projection system includes a light source and can use a pixel-based projection system. Each projected pixel can be varied by a parameter selected from the group consisting of light wavelength, light intensity, light frequency, and light amplitude. The image projection system can be configured to project an image based on a predetermined substrate signature, which can be a pixel-based representation of varying surface properties (heat, exposure dosages, critical dimension variations). The light source can be configured to provide actinic radiation to a given substrate. The light source can be configured to provide radiation of less that 400 nanometer wavelengths, such as ultraviolet radiation. A given light source can be selected to have a particular spectral line or lines based on a particular radiation-sensitive film on the substrate. Projection based on the predetermined substrate signature can include a substrate signature that spatially maps different characteristics of the substrate surface.

In other embodiments, a given projected image can be based on both a substrate signature and based on a CD etch signature of a given/particular etch chamber. A CD etch signature of a given etch chamber represents or identifies various etch non-uniformities that result from a given etch pattern transfer process. For example, with plasma-based dry etch chambers, there are typically etch non-uniformities across a surface of a substrate depending on a particular type of plasma reactor. For example, plasma can have center-to-edge density variation and/or azimuthal density variation. Accordingly, more or less etching can occur at some areas of a substrate as compared to other areas. The result is an etched substrate with a transferred pattern having CD non-uniformities (even if the etch mask had uniform CDs). Systems and methods herein can compensate for such etch non-uniformities. By basing a projected image on both a substrate signature (incoming CD signature) and data identifying how a given etch chamber will or has typically etched a substrate, then the result is projecting an image to create a pre-biased CD that enables CD normalization during a subsequent etch procedure. By way of a non-limiting example, if a given etch system etches more in a center portion of a substrate and less in an edge portion of a substrate, then a projected image can be configured to adjust incoming CDs and bias the CDs so that there are larger (or smaller) CDs in the center portion as compared to the edge. Then when the substrate is etched, the incoming CDs already account for etch non-uniformities such that a resulting etch yields uniform CDs across the substrate.

Note that substrates such as semiconductor wafers are typically rested or mounted on their backside surface (with the backside surface facing the ground) while processes such as coating, baking, lithography, developing, etching, etc., are executed on the opposite surface. As such, the working surface usually faces upwardly and is thus an "upper surface" being opposite to the backside surface. Upper surface then refers to a surface opposite the backside surface, in other words, the working surface. In some fabrication processes, such as electroplating, substrates can be held vertically. In such a vertical configuration the working surface faces the side and thus the upper surface faces the side, but is nevertheless the upper surface.

The processing system can also include a CD metrology system configured to identify a pixel-based CD signature of the substrate. The image projection system can use a laser galvanometer, digital light processing (DLP) device or grating light valve (GLV) device to project the image onto the working surface of the substrate. Any image projection device can be used that can modulate optical intensities by location. The system can include a dispense system configured to dispense liquid compositions on the surface of the substrate in a same processing chamber. The chamber can be positioned within a semiconductor fabrication tool that includes at least one module that dispenses liquid on a spinning substrate, and includes at least one module with a heating mechanism for heating a substrate. Such tools are sometimes known as coaters/developers. In another embodiment, the chamber is positioned within a semiconductor fabrication tool that includes at least one module configured to dispense photoresist on a substrate, at least one module configured to dispense developing chemicals on a substrate, at least one module to measure CDs, and at least one module configured to bake a substrate. Other systems can be embodied as a scanner/stepper tool that includes a micro-mirror projection system or pixel-based projection system. Such an embodiment can be configured with a processing chamber being a separate module from a lithographic exposure stack, or located to project an image on a substrate surface during lithographic exposure.

In other embodiments, the image projection system is configured to project a given image on to the working surface of the wafer line-by-line. In another embodiment, the image projection system is configured to project a given image on to the working surface of the wafer by using one or more mirrors configured to move a laser beam across the working surface and vary an amount of laser radiation directed at each pixel location of the working surface of the substrate. For example, such an image projection system can include using a laser galvanometer. The image projection system can be configured to project a given image on to the working surface of the substrate in less than, for example 30 seconds. Alternatively, a given image can be projected multiple times per second on to the working surface of the substrate. For example, a laser galvanometer has a raster scanning or raster-based projection mechanism. Such raster-based projection can include projecting a laser beam across a substrate surface line by line. Projection speeds can range from around hundreds of times per second, to once every few seconds or longer. As the laser galvanometer moves a given laser beam or UV light beam across the substrate, intensity of the laser beam can be varied from zero to 100 percent at each pixel location or resolution point on the working surface of the substrate. For example, an acoustic optical modulator can be used to modulate light intensities per point location on a given substrate surface. Alternatively, dwell time of projected radiation at a given pixel location can also be varied to provide a desired dosage of light.

Another embodiment includes a method of treating a substrate. This method includes positioning a substrate on a substrate holder. Positioning a substrate can include receiving the substrate in a module of a semiconductor fabrication tool. This semiconductor fabrication tool can include at least on module that dispenses photoresist on substrate. Such fabrication tools can include substrate handling mechanisms for automated moving of substrates among processing modules. Light is then projected onto a surface of the substrate via a grid-based light projection system configured to vary amplitude of projected light by location. Typical photolithographic light exposure is executed using a mask or reticle which blocks a portion of light so that a pattern of light reaches the substrate surface. In contrast, a grid-based light projection system projects light as an array or matrix of points, in which each projected point can be switched on or off and/or varied in frequency or amplitude. Projected light is then varied by amplitude on the surface of the substrate by location on the substrate with the variation being based a substrate signature. Projecting light onto the surface of the substrate can include projecting an image onto the substrate via a laser galvanometer or digital light processing (DLP) device. A particular projected image can be based on a predetermined signature of properties corresponding to the substrate or features thereon. Such a signature can include critical dimension signature, heat signature, light reflection signature, surface energy, x-rays, microwaves, etc. The image generated can be based on a predetermined or real time measured critical dimension (CD) signature corresponding to the substrate, or a predetermined lithographic exposure signature corresponding to the substrate, which can be a result of raster delay or flare. Such signatures can compensate for raster scan/exposure delay and extreme ultraviolet (EUV) flare.

Note that a given substrate signature can be identified from previous substrates having been processed by a particular tool, set of tools, and/or process sequence. In other words, substrate signatures can be calculated in real time for a substrate being processed, or calculated/observed from a repeating pattern of signatures for a given microfabrication process. Such a repeating pattern can be due to artifacts of a particular tool and/or material used. Substrate properties can include optical properties, electrical properties, mechanical properties, structure height, film thickness, temperature, etc.

In some embodiments, the laser galvanometer or digital light processing device is configured to project an image of independently addressable pixels onto the surface of the substrate. The digital light processing device can be configured to vary a light intensity of each independently addressable pixel.

Another embodiment includes a method of treating a substrate. A substrate is positioned on a substrate holder within a processing chamber. A pixel-based image is projected onto a surface of the substrate via a digitally-controlled, micro-mirror projection device, with the pixel-based image being generated based on a substrate signature. The substrate can included a layer having photo-reactive agents such that the projected pixel-based image causes the photo-reactive agents to chemically react to the pixel-based image based on amplitude and/or wavelength of projected light at given point locations on the substrate. In other words, a pattern of projected light can assist with causing photo-reactive agents to generate acids, bases, or other solubility shifting materials. The substrate signature can correspond to a predetermined heat signature of temperatures on the substrate surface. Projecting the pixel-based image can include varying light intensity, duration, and wavelength by each projected pixel.

In another embodiment, a method of treating a substrate includes positioning a substrate on a substrate holder of a semiconductor fabrication tool. Heating the substrate on the substrate holder using a heating mechanism located within the substrate holder, and spatially adjusting a surface temperature of the substrate by projecting a pixel-based image onto the substrate using a digitally-controlled micro-mirror projection device. The pixel-based image varies light amplitude by individually addressable pixels, and the projected pixel-based image is based on a heat signature of the substrate.

Another embodiment includes receiving a substrate having a film used with directed self-assembly of block copolymers. An image is projected onto the substrate film using digital light projection such that the image modifies the film according to a spatially-projected image. A film of block copolymers is applied, and self-assembly is activated or initiated such that copolymers assemble into a pattern based on the spatially-projected (pixel-based) image.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A processing system for treating substrates, the processing system comprising:
a chamber sized and configured to receive a substrate for processing;
a substrate holder positioned within the chamber and configured to hold the substrate;
an image projection system configured to project an image onto a working surface of the substrate when the substrate is in the chamber, the image projection system using a micro-mirror projection device to project the image; and
a controller configured to control the image projection system and cause the image projection system to project a pixel-based image onto the working surface of the substrate, wherein the image projection system is configured to project the image based on a predetermined substrate signature that includes a critical dimension (CD) signature corresponding to the substrate.

2. The processing system of claim 1, wherein the image projection system uses a pixel-based projection system.

3. The processing system of claim 2, wherein each projected pixel can be varied by a parameter selected from the group consisting of light intensity and light amplitude.

4. The processing system of claim 1, wherein the image projection system is configured to project a given image on to the working surface of the substrate line-by-line.

5. The processing system of claim 1, wherein the image projection system is configured to project the image based additionally on a CD etch signature of a given etch chamber.

6. The processing system of claim 1, wherein the image projection system is configured to project the image to create a biased CD signature on a substrate for CD normalization during a subsequent etch process.

7. The processing system of claim 4, wherein the image projection system is configured to project a given image on to the working surface of the substrate by using one or more mirrors configured to move a laser beam across the working surface and vary an amount of laser radiation directed at each pixel location of the working surface of the substrate.

8. The processing system of claim 7, wherein the image projection system includes a laser galvanometer device.

9. The processing system of claim 8, wherein the image projection system includes a light source configured to provide actinic radiation to a given substrate.

10. The processing system of claim 9, wherein the light source is configured to provide radiation of less than 400 nanometer wavelengths.

11. The processing system of claim 1, wherein the image projection system uses a digital light processing (DLP) device or grating light valve (GLV) device or laser galvanometer device to project the image onto the working surface of the substrate.

12. The processing system of claim 11, wherein the image projection system is configured to project a given image on to the working surface of the substrate in less than 60 seconds.

13. The processing system of claim 11, wherein the image projection system is configured to project a given image on to the working surface of the substrate multiple times per second.

14. The processing system of claim 11, wherein each projected pixel intensity is based on a critical dimension signature of the substrate.

15. The processing system of claim 11, wherein the chamber is positioned within a semiconductor fabrication tool that includes at least one module that dispenses liquid on a spinning substrate, and includes at least one module with a heating mechanism for heating a substrate.

16. The processing system of claim 11, wherein the chamber is positioned within a semiconductor fabrication tool that includes:
at least one module configured to dispense photoresist on a substrate;
at least one module configured to dispense developing chemicals on a substrate; and
at least one module configured to bake a substrate.

17. A processing system for treating substrates, the processing system comprising:
a chamber sized and configured to receive a substrate for processing;
a substrate holder positioned within the chamber and configured to hold the substrate;
an image projection system configured to project an image onto a working surface of the substrate when the substrate is in the chamber, the image projection system using a micro-mirror projection device to project the image; and
a controller configured to control the image projection system and cause the image projection system to project a pixel-based image onto the working surface of the substrate in which the pixel-based image is based on a substrate signature that spatially maps different characteristics of the working surface of the substrate and that includes a critical dimension (CD) signature corresponding to the substrate.

18. The processing system of claim 17, wherein the image projection system is configured to project a given image on to the working surface of the substrate by using one or more mirrors configured to move a laser beam across the working surface and vary an amount of laser radiation directed at each pixel location of the working surface of the substrate, and wherein the controller is configured to generate the pixel-based image based on a critical dimension signature of the substrate.

19. The processing system of claim 17, wherein the image projection system is further configured to project the image based on a CD etch signature of a particular etch chamber.

* * * * *